(12) United States Patent
Tang

(10) Patent No.: US 8,613,306 B2
(45) Date of Patent: Dec. 24, 2013

(54) LIQUID COOLING SYSTEM

(75) Inventor: Xian-Xiu Tang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 590 days.

(21) Appl. No.: 12/979,297

(22) Filed: Dec. 27, 2010

(65) Prior Publication Data

US 2012/0145360 A1    Jun. 14, 2012

(30) Foreign Application Priority Data

Dec. 9, 2010    (CN) .......................... 2010 1 0580877

(51) Int. Cl.
*F28F 7/00*    (2006.01)
*H05K 7/20*    (2006.01)

(52) U.S. Cl.
USPC .......................................... 165/80.4; 165/76

(58) Field of Classification Search
USPC ........ 165/80.4, 80.5, 104.31, 104.33, 104.22, 165/108, 67, 76, 79, 11.1; 361/679.53, 361/679.46, 699, 707, 701, 702; 62/259.2
See application file for complete search history.

(56) References Cited

U.S. PATENT DOCUMENTS

| | | | | |
|---|---|---|---|---|
| 6,313,990 B1 * | 11/2001 | Cheon | ........................... | 361/699 |
| 6,763,880 B1 * | 7/2004 | Shih | ............................. | 165/80.4 |
| 6,856,509 B2 * | 2/2005 | Lin | ........................... | 361/679.02 |
| 6,955,212 B1 * | 10/2005 | Hsieh | ........................... | 165/80.4 |
| 2003/0151892 A1 * | 8/2003 | Kondo et al. | ................. | 361/687 |
| 2004/0221604 A1 * | 11/2004 | Ota et al. | ..................... | 62/259.2 |

* cited by examiner

*Primary Examiner* — Tho V Duong
(74) *Attorney, Agent, or Firm* — Altis Law Group, Inc.

(57) ABSTRACT

A heat conductive member is connected to a heat-generating electronic component. A liquid tank defines a liquid injection hole. A clip assembly is connected to the liquid tank. When pressed against the clip assembly, the liquid tank is fastened by the clip assembly and retained in position. When pressed again toward the clip assembly, the liquid tank is released from the clip assembly and ejected in a direction away from the heat-generating electronic component. The liquid tank includes a tube portion and a rotation wheel. The tube portion includes a hollow tube and a positioning portion formed along a sidewall at a first end of the tube. The rotation wheel is fixed on the positioning portion and adjacent to the sidewall. The blades of the rotation wheel oppose the hollow of the tube. A second end of the tube is connected to the conduits.

12 Claims, 7 Drawing Sheets

LIQUID COOLING SYSTEM

CROSS-REFERENCE OF RELATED APPLICATION

Relevant subject matter is disclosed in a co-pending U.S. patent application with application Ser. No. 12/869,782, filed on Aug. 27, 2010, and entitled "LIQUID COOLING SYSTEM AND ELECTRONIC DEVICE INCORPORATING THE SAME", which is assigned to the same assignee as this patent application.

BACKGROUND

1. Technical Field

The disclosure generally relates to device cooling, and particularly to a liquid cooling system.

2. Description of Related Art

It is well known that heat is generated by many kinds of electronic components, such as integrated circuit chips, during their operation. If the heat is not efficiently dissipated, the electronic components may suffer damage. Thus, liquid cooling systems are often used to cool the electronic components.

At present, most liquid cooling systems are placed inside of the host computers, if the liquid cooling systems fail to work, it may result in system crashes, causing heavy losses due to not finding the problem in time. Then while replenishment of the working liquid is done, the electronic device is required to be shut down, to prevent damage of electronic components in the electronic device, which may occur due to spillage of the liquid. The liquid cooling system may even be required to be disassembled from the electronic device. Time is wasted, and the necessary operations are rather complicated.

BRIEF DESCRIPTION OF THE DRAWINGS

Many aspects of the embodiments can be better understood with reference to the following drawing. The components in the drawing are not necessarily drawn to scale, the emphasis instead being placed upon clearly illustrating the principles of the present embodiments. Moreover, in the drawing, like reference numerals designate corresponding parts throughout the several views.

DETAILED DESCRIPTION

The disclosure, including the drawings, is illustrated by way of example and not by limitation. It should be noted that references to "an" or "one" embodiment in this disclosure are not necessarily to the same embodiment, and such references mean at least one.

Figure 1:
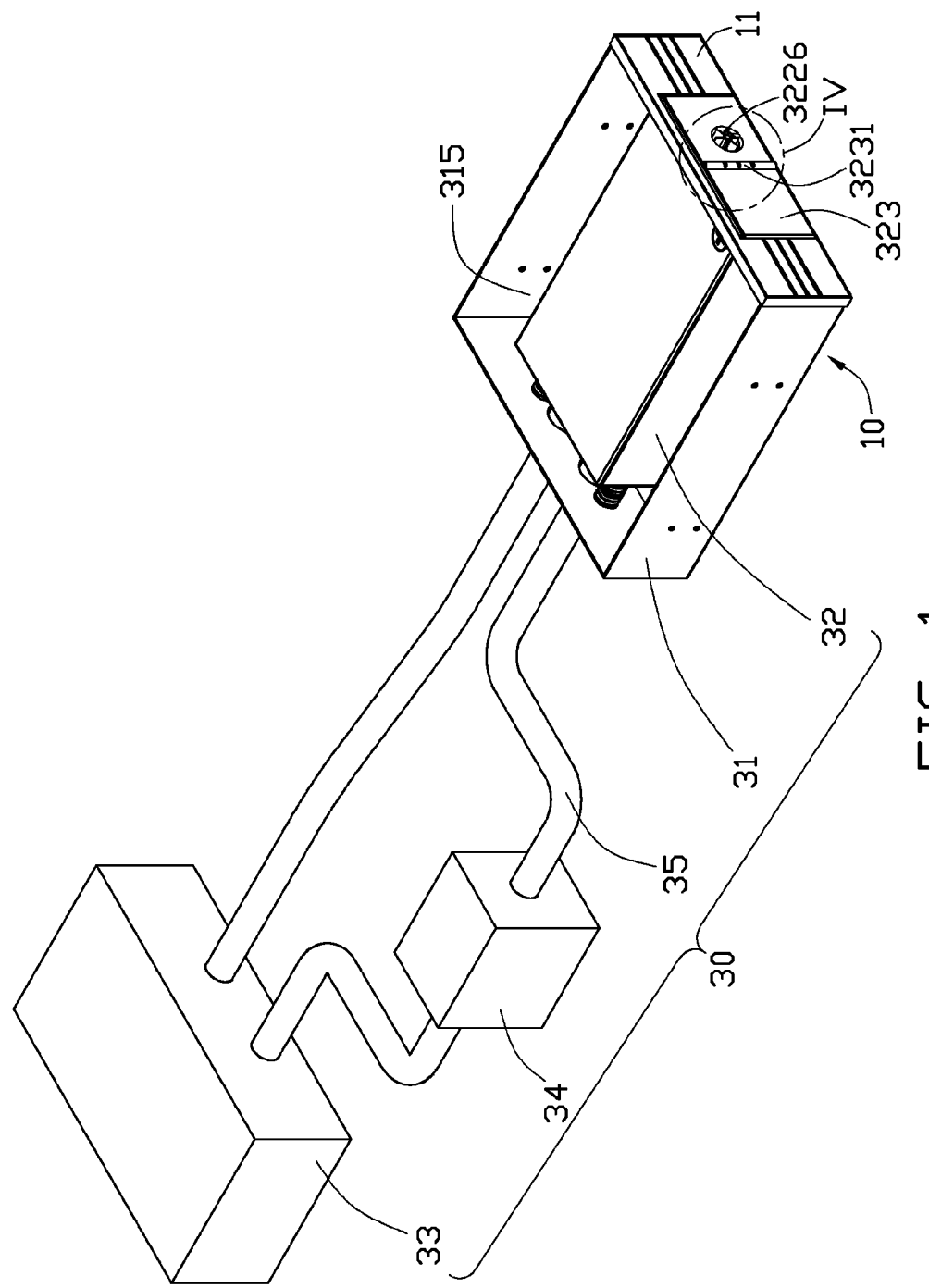
FIG. 1 is an assembled, isometric view of an electronic device incorporating a liquid cooling system in accordance with one embodiment of the disclosure.
Figure 2:
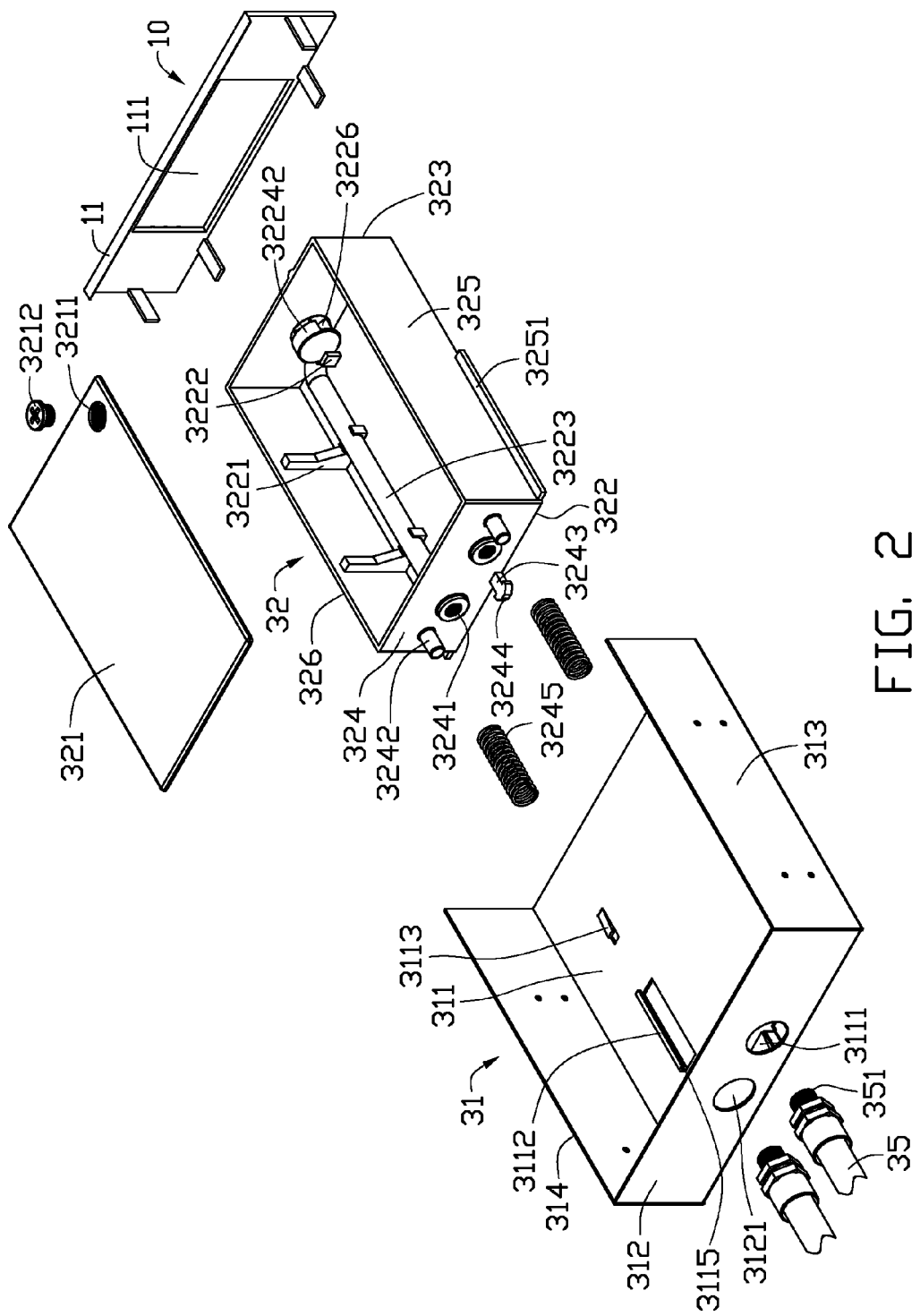
FIG. 2 is an enlarged, exploded view of part of the electronic device shown in FIG. 1.
Figure 3:
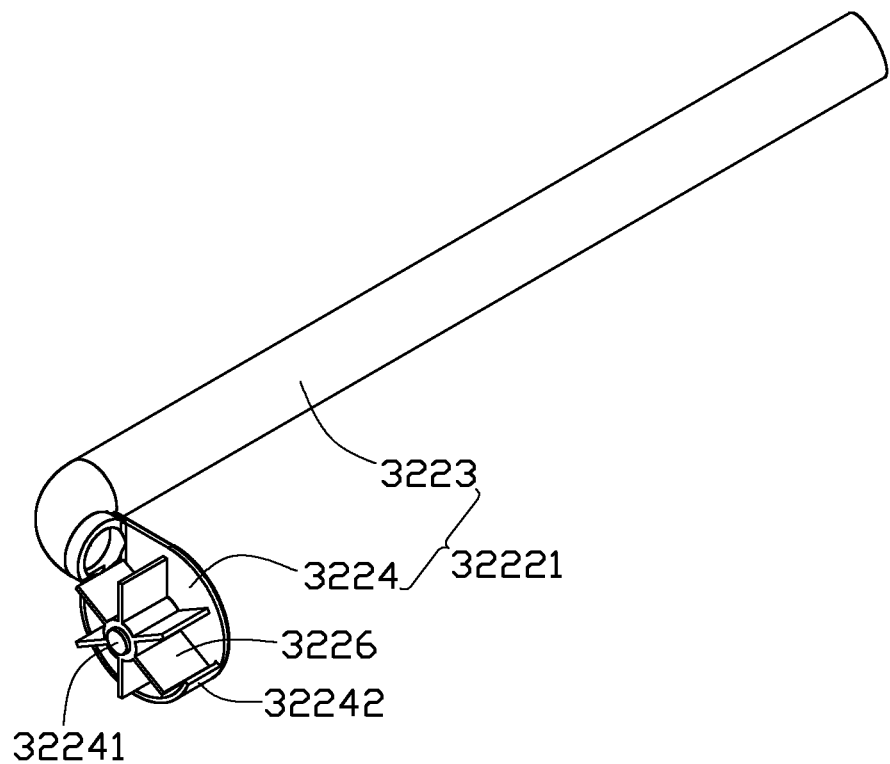
FIG. 3 is an enlarged view of a rotation wheel of FIG. 2.
Figure 4:
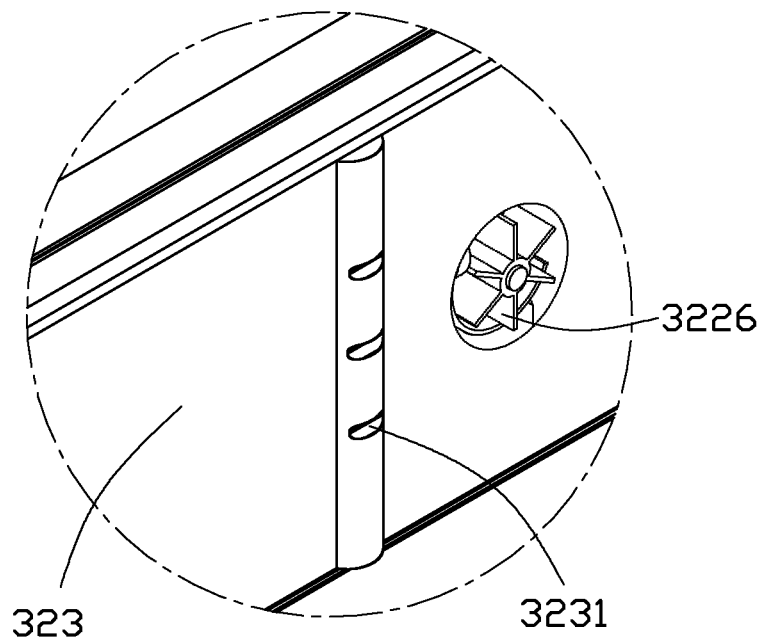
FIG. 4 is an enlarged view of a circled portion IV of the electronic device shown in FIG. 1.
Figure 5:
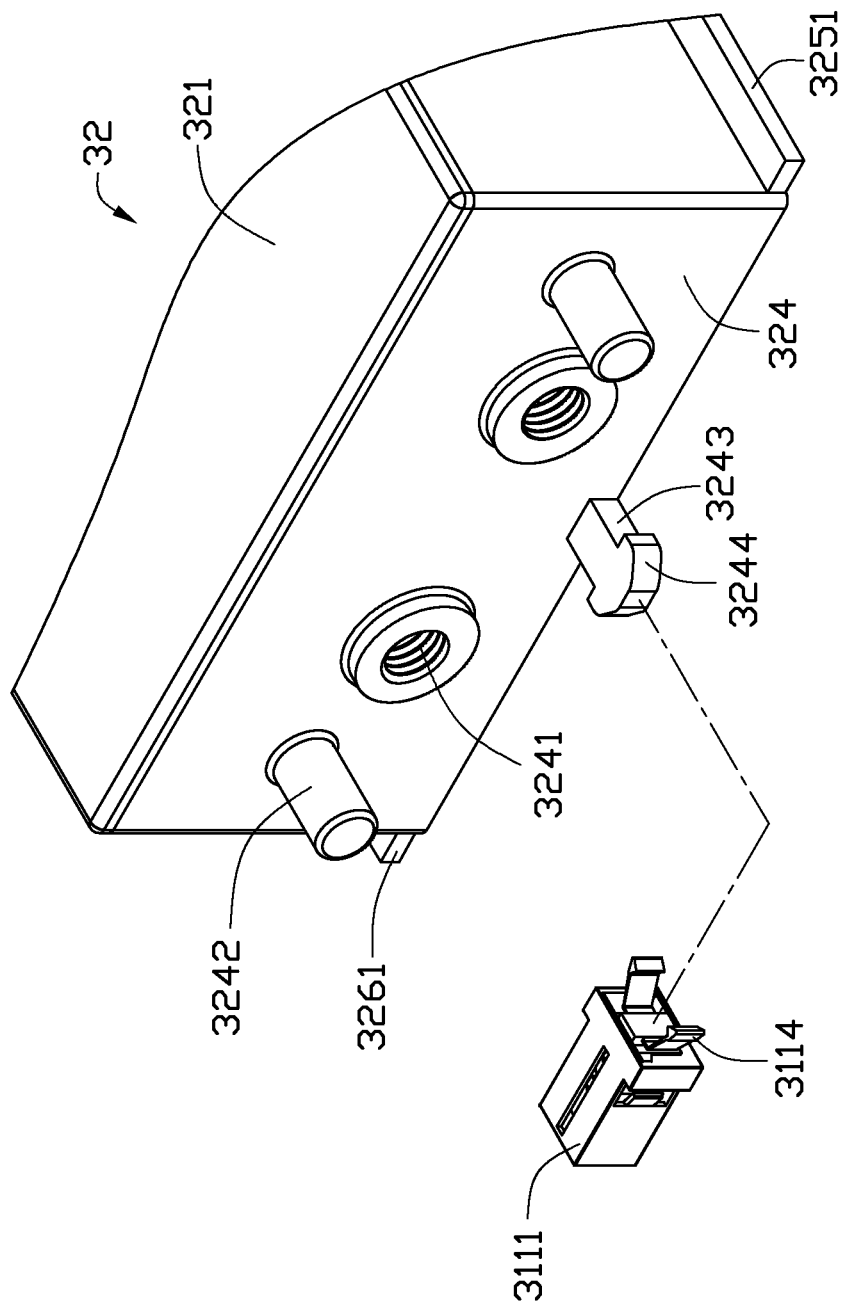
FIG. 5 is an enlarged view of part of a liquid tank and a door lock of the electronic device shown in FIG. 2.

Referring to FIG. 1, the liquid cooling system 30 is mounted in an electrical device. The electronic device includes a system enclosure 10, and the liquid cooling system 30 received in the enclosure 10. The electronic device can be a computer, a server or other devices. In this embodiment, only a part of a side plate 11 of the enclosure 10 is shown. The side plate 11 defines a rectangular opening 111 (shown in FIG. 2) therein.

The liquid cooling system 30 dissipates heat generated by a heat-generating electronic component (not shown), such as a central processing unit (CPU) or other component, in the enclosure 10. The liquid cooling system 30, in accordance with one embodiment of the disclosure includes a fixing member 31, a liquid tank 32 arranged on the fixing member 31, a heat conductive member 33, a liquid pump 34, and a plurality of conduits 35 in communication with the liquid tank 32, the heat conductive member 33 and the liquid pump 34.

Referring to FIGS. 2 to 5, the fixing member 31 is fixed on the side plate 11 of the enclosure 10. In one embodiment, the fixing member 31 is an optical disk driver (ODD) fixing structure. The fixing member 31 includes a square base plate 311, and a rear side plate 312, a left side plate 313 and a right side plate 314 extending perpendicularly from the base plate 311.

The rear, left and right side plates 312, 313, 314 have one-to-one correspondence relationships with respect to rear, left and right lateral sides of the base plate 311. The side plate 11 of the enclosure 10 is disposed at a front lateral side of the base plate 311. The rear side plate 312 opposes and is parallel to the side plate 11 of the enclosure 10. The rear side plate 312 defines two through holes 3121 through which the conduits 35 respectively extend. The left and right side plates 313, 314 are located between the rear side plate 312 and the side plate 11 of the enclosure 10. The rear, left and right side plates 312, 313, 314, the side plate 11 of the enclosure 10, and the base plate 311 cooperatively define a receiving space 315 (shown in FIG. 1) therebetween for receiving the liquid tank 32 therein.

The base plate 311 forms a door lock 3111, two fixing flanges 3112 and two stoppers 3113 thereon. The door lock 3111 abuts against the rear plate 312 at a rear end thereof, and includes two hooks 3114 at a front end thereof. The door lock 3111 is a conventional door lock. The door lock 3111 is capable of fastening and ejecting the liquid tank 32 by pressure applied by an external force. The fixing flanges 3112 and the stoppers 3113 are located at a middle portion of the base plate 311, and are punched up from the base plate 311. The fixing flanges 3112 are symmetrically disposed at opposite sides of the liquid tank 32. Each of the fixing flanges 3112 has an inverted L-shaped cross section. A sliding groove 3115 is defined between each fixing flange 3112 and the base plate 311. The sliding grooves 3115 oppose each other. The stoppers 3113 are also symmetrically disposed at the opposite sides of the liquid tank 32. The stoppers 3113 respectively align with the sliding grooves 3115. Each of the stoppers 3113 is laminar. One end of each stopper 3113 furthest from the corresponding fixing flange 3112 extends from the base plate 311, with the stopper 3113 extending obliquely upwardly generally toward the fixing flange 3112.

The liquid tank 32 is hollow and generally rectangular, and contains a working liquid (not shown) therein. The working liquid usually selected is water, methanol, or alcohol, which has a low boiling point. The liquid tank 32 includes a top surface 321, a bottom surface 322, and a front sidewall 323, a rear sidewall 324, a left sidewall 325, and a right sidewall 326 interconnecting the top and bottom surfaces 321 and 322. The top surface 321, the bottom surface 322, and the sidewalls 323, 324, 325, 326 are rectangular. In one embodiment, the front sidewall 323 is made from transparent material.

The top surface 321 defines a liquid injection hole 3211 in a front end thereof, adjacent to the side plate 11 of the enclosure 10. A seal 3212 is provided to seal the liquid injection hole 3211. In this embodiment, the liquid injection hole 3211 is a threaded hole, and the seal 3212 a threaded fastener. Alternatively, the liquid injection hole 3211 can be a non-threaded hole, and the seal 3212 can be rubber. The working liquid is injected into the liquid tank 32 from the liquid injection hole 3211.

The front sidewall 323 is located adjacent to the side plate 11 of the enclosure 10, and connects with front lateral sides of the top and bottom surfaces 321 and 322. The rear sidewall 324 is disposed away from the side plate 11 of the enclosure 10, and connects with rear lateral sides of the top and bottom surfaces 321, 322. The left and right sidewalls 324 are located between the front and rear sidewalls 323, 324, and respectively connect with corresponding left and right lateral sides of the top and bottom surfaces 321, 322.

The front sidewall 323 bears a plurality of transparent markings 3231 thereon, for indicating a level of the working liquid contained in the liquid tank 32. A width of the front sidewall 323, namely, a width of the liquid tank 32, is less than a width of the opening 111 of the side plate 11 of the enclosure 10.

The rear sidewall 324 includes two connecting holes 3241 defined therein, and two posts 3242 and an ear 3243 extending out therefrom. The connecting holes 3241 and the posts 3242 align with each other. The posts 3242 are respectively located at opposite ends of the rear sidewall 324. The connecting holes 3241 are located between the posts 3242, and respectively align with the through holes 3121 of the rear plate 312 of the fixing member 31. In this embodiment, the connecting holes 3241 are threaded holes. The ear 3243 extends toward the door lock 3111 of the fixing member 31 from a position of the rear plate 324 between the connecting holes 3241 and adjacent to the bottom surface 322. The ear 3243 includes a barb 3244 extending out from a free end thereof. The barb 3244 can be fastened on the hooks 3114 of the door lock 3111. A spring 3245 is disposed around each of the posts 3242. The spring 3245 in a relaxed state is longer than each post 3242. Alternatively, the spring 3245 can be another kind of elastic member between the rear sidewall 324 of the liquid tank 32 and the rear plate 312 of the fixing member 31, such as an elastic tab, or other elastic member.

A distance between the left and right sidewalls 325, 326 of the liquid tank 32, namely, a width of the liquid tank 32, is less than a width of the fixing member 31. Each of the left and right sidewalls 325, 326, namely, a length of the liquid tank 32, is shorter than the fixing member 31. Each of the left and right sidewalls 325, 326 includes a positioning flange 3251, 3261 extending perpendicularly from part of a bottom lateral side thereof adjacent to the bottom surface 322 and the rear sidewall 324. The positioning flanges 3251, 3261 are elongated and movably received respectively in the sliding grooves 3115 of the fixing member 31.

The liquid tank 32 includes two substantially L-shaped clamps 3221, a positioning piece 3222, a tube portion 32221, and a rotation wheel 3226. The clamps 3221 are formed on the bottom surface 322 and are connected to the sidewall 326. The positioning piece 3222 is formed on a center of the bottom surface 322 and is adjacent to the sidewall 323. The tube portion 32221 includes a substantially L-shaped hollow tube 3223 and a circular fixing portion 3224. The fixing portion 3224 is formed along a sidewall of the tube 3223 at a first end of the tube 3223. A half ring shaped sidewall 32242 is extended up from the fixing portion 3224. A rotation axis 32241 is extended from a center of the fixing portion 3224. The rotation wheel 3226 is fixed on the rotation axis 32241 and is connected to the fixing portion 3224. The blades of the rotation wheel 3226 oppose the hollow of the tube 3223. The tube 3223 is clamped in the clamps 3221. A second end of the tube 3223 opposes to the connecting hole 3241. The fixing portion 3224 resists against the positioning piece 3222. The rotation wheel 3226 is adjacent to the sidewall 323 for observing the states of the rotation wheel 3226 through the sidewall 323.

Referring back to FIG. 1, the heat conductive member 33 is made of metal or metal alloy with a high heat conductivity coefficient, such as copper, copper-alloy, or other suitable material. The heat conductive member 33 is hollow. The working liquid contained in the liquid tank 32 enters the heat conductive member 33 by the conduits 35. The heat conductive member 33 thermally contacts the heat-generating electronic component in the enclosure 10, transferring the heat generated by the heat-generating electronic component to the working liquid in the heat conductive member 33.

The liquid pump 34 circulates the working liquid in the liquid tank 32 and the heat conductive member 33, thereby enhancing the heat dissipation efficiency of the liquid cooling system.

The conduits 35 are flexible. Ends of the conduits 35 connecting with the liquid tank 32 each are provided a bolt 351. In one alternative embodiment, the conduits 35 can be telescopic. In such case, the conduits 35 are extendable and retractable according to movement of the liquid tank 32.

Figure 6:
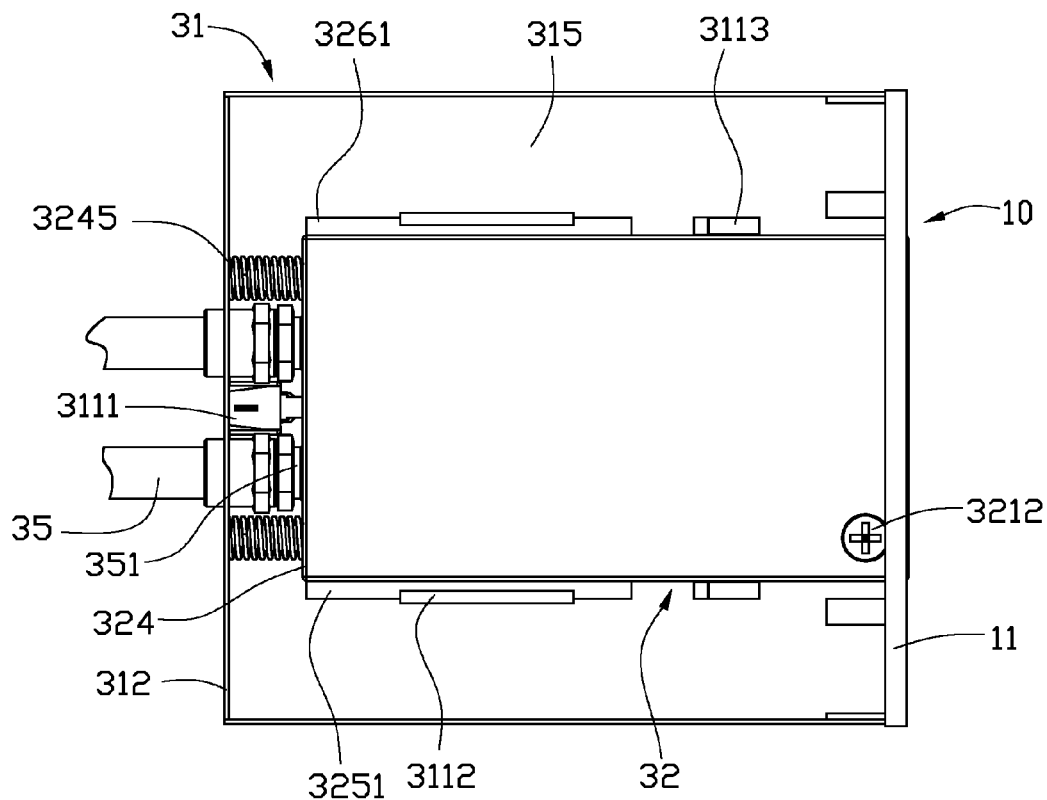
FIG. 6 is a top plan view of part of the electronic device shown in FIG. 1.

Referring to FIGS. 1 and 6, in assembling, the liquid tank 32 is slid into the receiving space 315 from one end of the fixing member 31 adjacent to the side plate 11 of the enclosure 10. The bolts 351 of the conduits 35 extend through the through holes 3121 of the fixing member 31, and are respectively threaded in the connecting holes 3241 of the liquid tank 32. The ear 3243 of the liquid tank 32 is mounted in the door lock 3111 of the fixing member 31. At this time, the positioning flanges 3251, 3261 of the liquid tank 32 are movably received in the sliding grooves 3115 of the fixing member 31. The springs 3245 disposed around the posts 3242 of the liquid tank 32 are compressed between the rear sidewall 324 of the liquid tank 32 and the rear plate 312 of the fixing member 31. The fixing member 31 is fixed on the side plate 11 of the enclosure 10. At this time, the front sidewall 323 of the liquid tank 32 is received in the opening 111 of the side plate 11 of the enclosure 10, and is exposed at an exterior of the enclosure 10. The front sidewall 323 is coplanar with the side plate 11.

Figure 7:
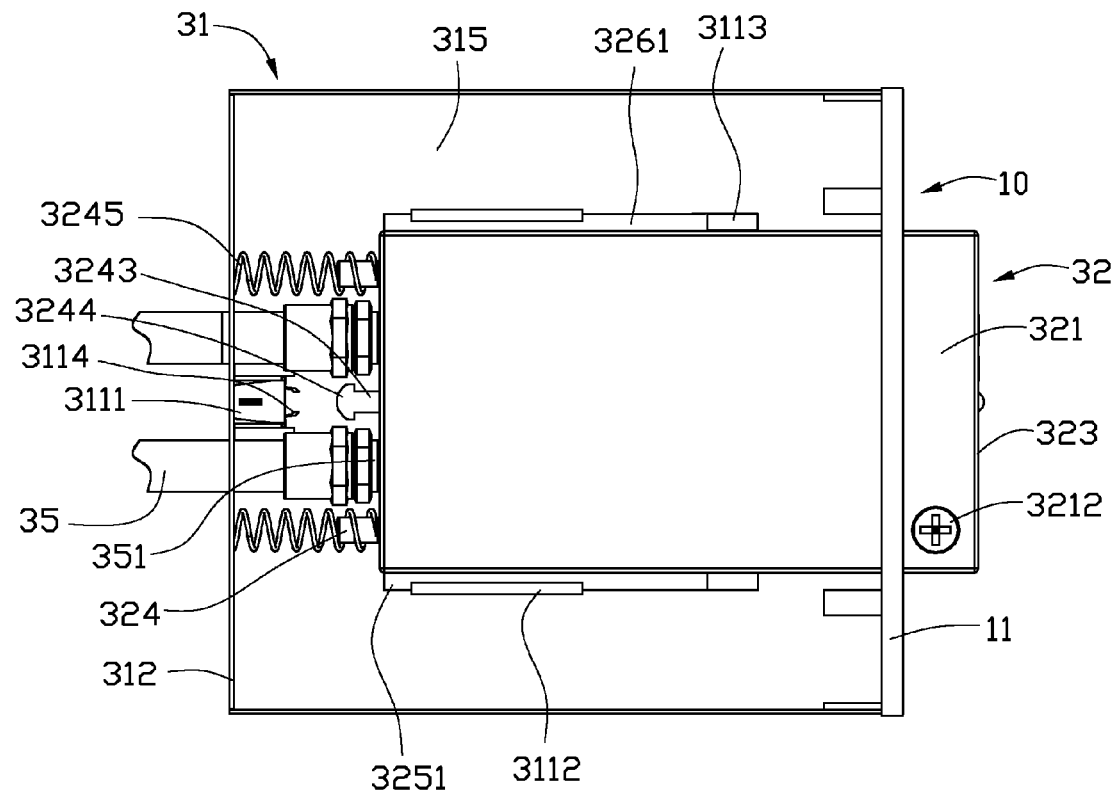
FIG. 7 is similar to FIG. 5, but shows the liquid tank partly ejected from an enclosure of the electronic device.

Referring to FIG. 7, when the prepared working liquid is added into the liquid tank 32, the front sidewall 323 of the liquid tank 32 is pressed toward the door lock 3111, and the liquid tank 32 is ejected toward the exterior of the enclosure 10 under the elastic force of the door lock 3111 and the springs 3245. The positioning flanges 3251 and 3261 of the liquid tank 32 slide in the sliding grooves 3115 of the fixing member 31, until the positioning flanges 3251 and 3261 respectively abut against the stoppers 3113 of the fixing member 31. At this time, a front end of the liquid tank 32 with the front sidewall 323 and the liquid injection hole 3211 is ejected out of the enclosure 10. The seal 3212 is removed from the liquid injection hole 3211, and the prepared working liquid is injected into the liquid tank 32 through the liquid injection hole 3211. After the working liquid is injected into the liquid tank 32, the seal 3212 is resealed in the liquid injection hole 3211. The front sidewall 323 of the liquid tank 32 is pressed again toward the door lock 3111, and the door lock 3111 securely fastens the tab 3243 of the liquid tank 32. Thus, the liquid tank 32 returns to its original position. When the liquid cooling system 30 works normally, the liquid flows between the heat conductive member 33 and the liquid tank 32, to drive the rotation wheel 3226 to rotate. The rotation wheel 3226 can be observed through the front sidewall 323. When the liquid cooling system 30 is not working correctly, the liquid does not flow between the heat conductive member 33 and the liquid tank 32. Thus, the rotation wheel 3226 does not rotate. Therefore, the host computer needs to be dissembled for checking the liquid cooling system 30, to prevent the system from being damaged.

In the electronic device and the liquid cooling system 30 thereof, the door lock 3111 of the fixing member 31, and the tab 3243 and the springs 3245 of the liquid tank 32, cooperatively form a clip assembly maintaining the liquid tank 32 in the enclosure 10 or ejecting the liquid tank 32 from the enclosure 10. When the liquid tank 32 is pressed against the clip assembly, the liquid tank 32 is fastened by the clip assembly and thus retained in position in the enclosure 10. When the liquid tank 32 is pressed again toward the clip assembly, the liquid tank 32 is released from the clip assembly and thus ejected. Therefore when working liquid is required to be injected into the liquid tank 32, the liquid injection hole 3211 of the liquid tank 32 can be ejected from the enclosure 10 and the liquid tank 32 can simultaneously be moved away from the heat-generating electronic component by pressing the liquid tank 32 toward the clip assembly.

With this mechanism, the working liquid can be conveniently added into the liquid tank 32, also is prevented from dropping onto and damaging the heat-generating electronic component. Thus, when the working liquid is replenished, the electronic device does not need to be shut down, and the liquid cooling system 30 does not need to be disassembled from the electronic device. This simplifies the maintenance and operation of the liquid cooling system 30. In addition, the liquid tank 32 includes the tube 3223 and the rotation wheel 3226, thus, liquid flows between the heat conductive member 33 and the liquid tank 32 to drive the rotation wheel 3226 to rotate. The rotation wheel 3226 can be observed through the front sidewall 323 to find fault in the liquid cooling system 30. Moreover, the front sidewall 323 of the liquid tank 32 has the markings 3231 formed thereon. The markings 3231 are exposed to the outside of the enclosure 10, and show the level of working liquid contained in the liquid tank 32. As a result, the working liquid can be added into the liquid tank 32 in a timely manner. This enhances the heat dissipation efficiency and reliability of the liquid cooling system 30.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A liquid cooling system comprising:
   a heat conductive member configured to be thermally connected to a heat-generating electronic component;
   a liquid tank defining a liquid injection hole therein;
   a plurality of conduits connecting the heat conductive member with the liquid tank; and
   a clip assembly connected to the liquid tank, wherein when the liquid tank is pressed against the clip assembly, the liquid tank is fastened by the clip assembly and retained in position, and when the liquid tank is pressed again toward the clip assembly, the liquid tank is released from the clip assembly and ejected in a direction away from the heat-generating electronic component;
   wherein the liquid tank comprises a tube portion and a rotation wheel, the tube portion comprising a hollow tube and a positioning portion, the positioning portion is formed along a sidewall at a first end of the tube, the rotation wheel is fixed on the positioning portion and adjacent to the sidewall, blades of the rotation wheel oppose to the hollow of the tube, a second end of the tube is connected to the conduits.

2. The liquid cooling system of claim 1, wherein the clip assembly comprises a door lock, an ear, and an elastic member, wherein when the door lock receives the ear, the liquid tank is retained by the elastic member, and when the door lock is released from the ear, the liquid tank is ejected by the elastic member.

3. The liquid cooling system of claim 2, further comprising a fixing member on which the liquid tank is located, wherein the door lock is formed on the fixing member, the ear is formed on the liquid tank, and the elastic member is disposed between the fixing member and the liquid tank.

4. The liquid cooling system of claim 3, wherein the fixing member is an optical disk driver fixing structure.

5. The liquid cooling system of claim 3, wherein the liquid tank comprises a post formed thereon, the elastic member is a spring disposed around the post, the door lock comprises a hook at one end thereof, the ear comprises a barb at one end thereof, and the barb of the ear is fastened on the hook of the door lock for retaining the liquid tank in place.

6. The liquid cooling system of claim 3, wherein the fixing member comprises a base plate and a side plate extending from the base plate, the liquid tank comprises a top surface, a bottom surface, and a plurality of sidewalls interconnecting the top and bottom surfaces, the spring is disposed between the side plate of the fixing member and one of the sidewalls of the liquid tank, the door lock is formed on the base plate of the fixing member, and the liquid injection hole is defined in the top surface of the liquid tank.

7. The liquid cooling system of claim 3, wherein the fixing member comprises a base plate and a side plate extending from the base plate, the base plate comprises a fixing flange formed thereon, disposed at an outer periphery of the liquid tank, a sliding groove is defined between the fixing flange and the base plate, the liquid tank comprises a top surface, a bottom surface, and a plurality of sidewalls interconnecting the top and bottom surfaces, one of the sidewalls comprises a positioning flange extending therefrom, and the positioning flange is movably received in the sliding groove of the fixing member.

8. The liquid cooling system of claim 7, wherein the liquid tank comprises two substantially L-shaped clamps and a positioning piece, the clamps are formed on the bottom surface and connected to the sidewall, the positioning piece is formed on a center of the bottom surface and adjacent to the sidewall, a half ring shaped sidewall is extended toward up from the fixing portion, a rotation axis is extended from a center of the fixing portion, the rotation wheel is fixed on the rotation axis and resisted against the fixing portion, the tube is clamped in the clamps, the fixing portion resists against the positioning piece.

9. The liquid cooling system of claim 7, wherein the base plate of the fixing member further comprises a stopper away from the clip assembly, and the stopper is disposed at the outer periphery of the liquid tank, and aligns with the sliding groove.

10. The liquid cooling system of claim 9, wherein the stopper is laminar, and is punched from the base plate of the fixing member, one end of the stopper furthest from the corresponding fixing flange extends from the base plate, with the stopper extending obliquely upwardly generally toward the fixing flange.

11. The liquid cooling system of claim 1, wherein the liquid tank further comprises a sidewall having a plurality of markings formed thereon, and the sidewall is made of transparent material.

12. The liquid cooling system of claim 1, wherein the conduits are flexible or telescopic.

* * * * *